US008912591B2

(12) United States Patent
Baek et al.

(10) Patent No.: US 8,912,591 B2
(45) Date of Patent: Dec. 16, 2014

(54) THREE-DIMENSIONAL NON-VOLATILE MEMORY DEVICE, MEMORY SYSTEM INCLUDING THE SAME AND METHOD OF MANUFACTURING THE SAME

(75) Inventors: Yong Mook Baek, Yongin-si (KR); Jung Ryul Ahn, Namyangju-si (KR)

(73) Assignee: SK Hynix Inc., Gyeonggi-do (KR)

( * ) Notice: Subject to any disclaimer, the term of this patent is extended or adjusted under 35 U.S.C. 154(b) by 281 days.

(21) Appl. No.: 13/601,301

(22) Filed: Aug. 31, 2012

(65) Prior Publication Data
US 2013/0148398 A1 Jun. 13, 2013

(30) Foreign Application Priority Data

Dec. 13, 2011 (KR) .................. 10-2011-0133739

(51) Int. Cl.
*H01L 27/115* (2006.01)
(52) U.S. Cl.
CPC .............. *H01L 27/11582* (2013.01)
USPC .............. 257/324; 257/522; 257/E27.103; 257/E29.309
(58) Field of Classification Search
CPC ........... G11C 16/0433; G11C 16/0466; H01L 27/115; H01L 27/11517; H01L 27/11551; H01L 27/11556; H01L 27/11563; H01L 27/11578; H01L 27/11582

USPC ....... 365/185.17, 51; 257/324, 522, E27.103, 257/E29.309
See application file for complete search history.

(56) References Cited

U.S. PATENT DOCUMENTS

| 7,847,334 | B2 * | 12/2010 | Katsumata et al. ........... 257/315 |
| 8,445,347 | B2 * | 5/2013 | Alsmeier ...................... 438/264 |
| 8,492,797 | B2 * | 7/2013 | Hwang et al. ................. 257/208 |
| 8,658,499 | B2 * | 2/2014 | Makala et al. ................ 438/264 |
| 2010/0207193 | A1 * | 8/2010 | Tanaka et al. ................. 257/324 |

FOREIGN PATENT DOCUMENTS

| KR | 1020100091835 A | 8/2010 |
| KR | 1020100122701 A | 11/2010 |
| KR | 1020120066331 A | 6/2012 |

* cited by examiner

*Primary Examiner* — Allison P Bernstein
(74) *Attorney, Agent, or Firm* — William Park & Associates Patent Ltd.

(57) ABSTRACT

A three-dimensional (3-D) non-volatile memory device includes a plurality of vertical channel layers protruding from a substrate, a plurality of interlayer insulating layers and a plurality of memory cells stacked alternately along the plurality of vertical channel layers, and an air gap formed in the plurality of interlayer insulating layers disposed between the plurality of memory cells, so that capacitance between word lines is reduced to thus improve a program speed.

19 Claims, 8 Drawing Sheets

THREE-DIMENSIONAL NON-VOLATILE MEMORY DEVICE, MEMORY SYSTEM INCLUDING THE SAME AND METHOD OF MANUFACTURING THE SAME

CROSS-REFERENCE TO RELATED APPLICATION

The present application claims priority to Korean patent application number 10-2011-0133739 filed on Dec. 13, 2011, in the Korean Intellectual Property Office, the entire disclosure of which is incorporated by reference herein.

BACKGROUND

1. Field of Invention

The present invention relates generally to a semiconductor device and a method of manufacturing the same and, more particularly, to a three-dimensional non-volatile memory device, a memory system including the same and a method of manufacturing the same.

2. Related Art

A non-volatile memory device retains data even in the absence of a power supply. Two-dimensional memory devices in which memory cells are fabricated in a single layer over a silicon substrate are reaching physical limits, preventing higher levels of integration. Accordingly, three-dimensional non-volatile memory devices in which memory cells are stacked in a vertical direction over a silicon substrate have been proposed.

FIG. 1 is a cross-sectional view illustrating the structure of a conventional three-dimensional structured non-volatile memory device.

As shown in FIG. 1, the conventional three-dimensional (3D) structured non-volatile memory device may include a plurality of memory cells MC stacked along channels CH that protrude from the substrate 10. The memory cells MC may be coupled in series between a lower select transistor LST and an upper select transistor UST, thus forming a single string. In addition, the conventional 3D structured non-volatile memory device may include bit lines BL that are coupled to the channels CH.

In FIG. 1, gate insulating layers are denoted by "11" and "16," lower select lines are denoted by "13," word lines are denoted by "15," and upper select lines are denoted by "17." In addition, an interlayer insulating layer is denoted by "12," which may generally comprise of an oxide layer.

Since the interlayer insulating layer between cells of the conventional 3D structured non-volatile memory device comprises of an oxide layer, there may be excessively high capacitance (A) between the word lines, which may increase the time taken for cells to be programmed.

BRIEF SUMMARY

An embodiment of the present invention relates to a three-dimensional non-volatile memory device configured to improve the program speed of cells by reducing capacitance between word lines and a method of manufacturing the same.

A three-dimensional (3-D) non-volatile memory device according to an embodiment of the present invention includes a plurality of vertical channel layers protruding from a substrate, a plurality of interlayer insulating layers and a plurality of memory cells stacked alternately along the plurality of vertical channel layers, and an air gap formed in the plurality of interlayer insulating layers disposed between the plurality of memory cells.

A memory system according to an embodiment of the present invention includes: the 3-D non-volatile memory device, and a memory controller configured to control the 3-D non-volatile memory device.

A method of manufacturing a three-dimensional (3-D) non-volatile memory device according to an embodiment of the present invention includes forming a stacked structure by alternately stacking a plurality of first sacrificial layers and a plurality of second sacrificial layers over a substrate, forming a plurality of vertical holes passing through the stacked structure, forming a plurality of channels by forming memory layers and channel layers along surfaces of the plurality of vertical holes, forming slits passing through the stacked structure between the plurality of channels to expose sidewalls of the first sacrificial layers and the second sacrificial layers, etching portions of the sidewalls of the first sacrificial layers such that the sidewalls of the first sacrificial layer have a semi-circular shape, removing the second sacrificial layers, forming word line conductive layers in spaces from which the second sacrificial layers are removed, removing the first sacrificial layers, and forming an interlayer insulating layer in the spaces from which the second sacrificial layers are removed such that an air gap is formed between the word line conductive layers.

DETAILED DESCRIPTION

Hereinafter, various embodiments of the present disclosure will be described in detail with reference to the accompanying drawings. The figures are provided to allow those having ordinary skill in the art to understand the scope of the embodiments of the disclosure. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

FIGS. 2 to 14 are cross-sectional views illustrating a method of manufacturing a three-dimensional (3-D) non-volatile memory device according to an embodiment of the present invention.

Figure 1:
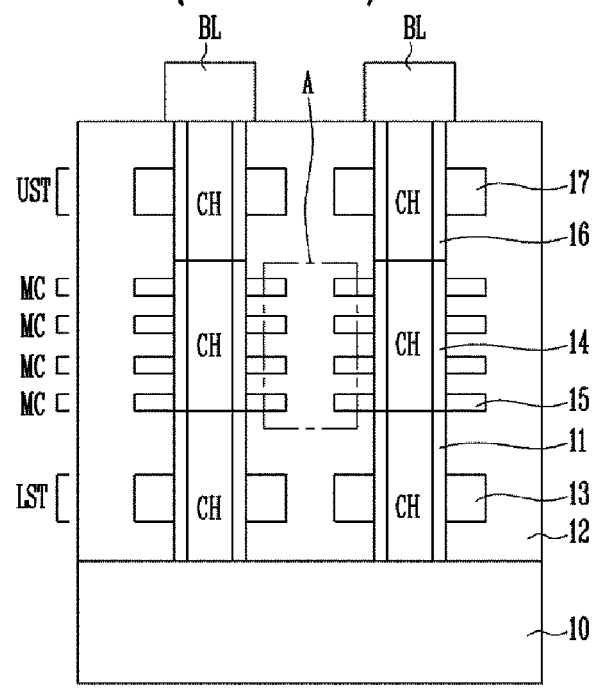
FIG. 1 is a cross-sectional view illustrating the structure of a conventional three-dimensional (3-D) non-volatile memory device.
Figure 2:
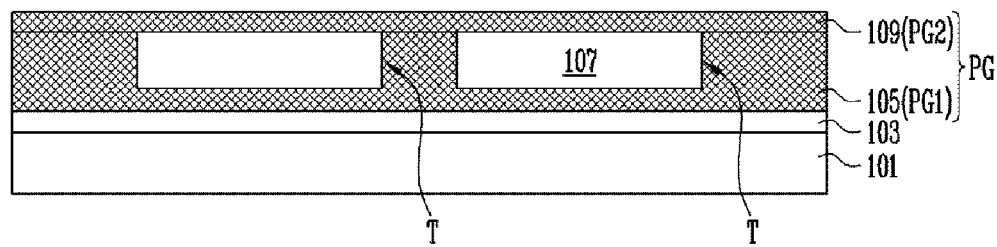
FIGS. 2 to 14 are cross-sectional views illustrating a method of manufacturing a non-volatile memory device according to an embodiment of the present invention.

Referring to FIG. 2, a first interlayer insulating layer 103 may be formed over a substrate 101. Subsequently, a pipe gate PG that has first sacrificial layers 107 embedded therein may be formed on the first interlayer insulating layer 103.

The first interlayer insulating layer 103 may be formed to insulate the pipe gate PG from the substrate 101, and may comprise of silicon oxide ($SiO_2$).

The pipe gate PG may include a first conductive layer 105 for a first pipe gate PG1 and a second conductive layer 109 for a second pipe gate PG2. The first conductive layer 105 may be formed over the first interlayer insulating layer 103, and subsequently may be partially etched to form a plurality of trenches T in the first conductive layer 105. The trenches T may be arranged substantially in a matrix form including a plurality of columns and a plurality of rows, and may be filled with the first sacrificial layers 107, which may comprise of nitride or TiN. A second conductive layer 109 may be formed over the entire structure having the first sacrificial layers 107. The first and second conductive layers 105 and 109 may comprise of polysilicon layers.

Figure 3:
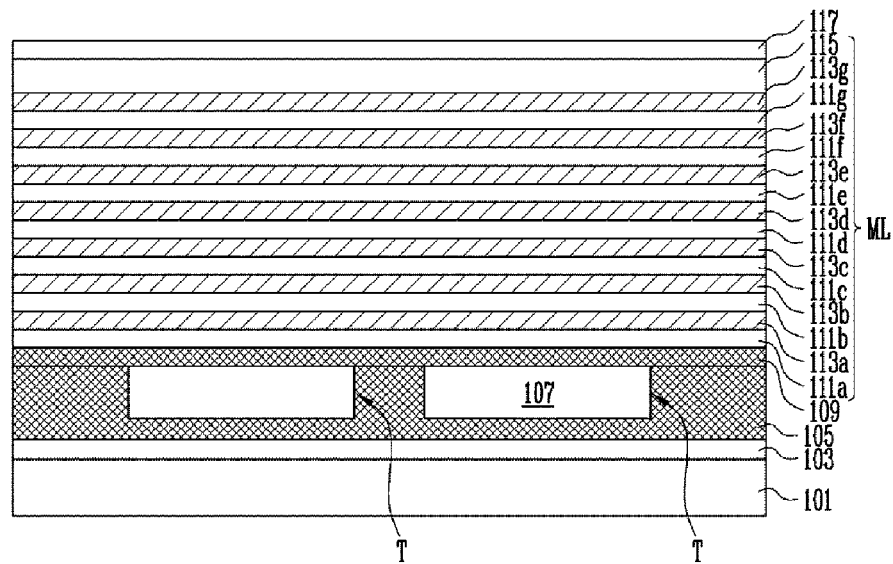

Referring to FIG. 3, a plurality of second sacrificial layers 111a to 111g and 115 may be alternately stacked with a plurality of third sacrificial layers 113a to 113g over the entire structure having the second conductive layer 109, thus forming a stacked structure ML. The second sacrificial layers 111a to 111g and 115 and the third sacrificial layers 113a to 113g may be formed of materials having an etch selectivity therebetween, such as oxide and nitride, respectively. The second sacrificial layer 111a may be formed before the third sacrificial layer 113a is formed, and the number of third sacrificial layers 113a to 113g may vary according to the number of memory cells to be formed. The second sacrificial layer 115 may be the uppermost layer of the stacked structure ML.

A hard mask layer 117 may be formed over the stacked structure ML, and may be formed of a material having an etch selectivity with respect to the second sacrificial layers 111a to 111g and 115 and the third sacrificial layers 113a to 113g.

Figure 4:
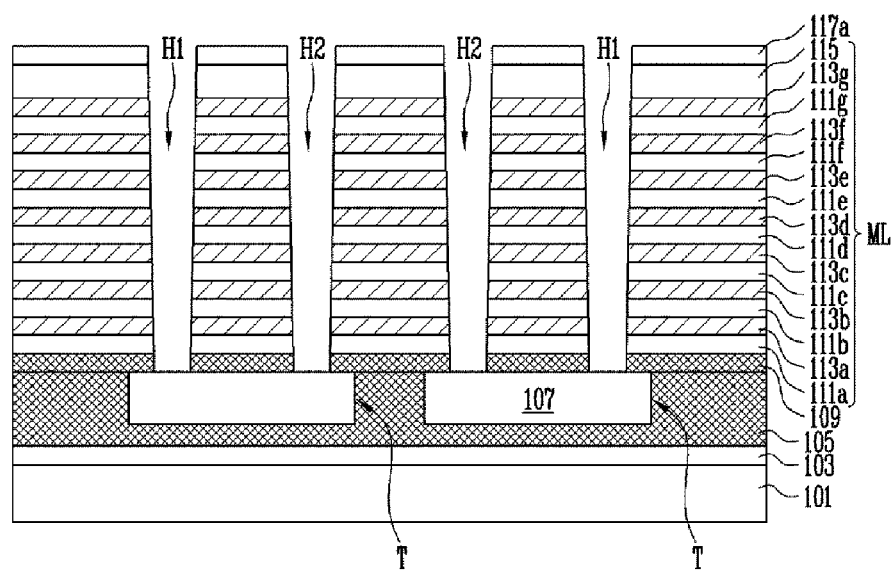

Referring to FIG. 4, the hard mask layer 117 may be patterned by using a photolithography process to form hard mask patterns 117a, and may expose portions of the stacked structure ML, in which vertical holes H1 and H2 may be formed. The second conductive layer 109 and the portions of the stacked structure ML exposed through the hard mask patterns 117a may be removed by an etch process to form the vertical holes H1 and H2, which may be coupled to both ends of each trench T, thereby exposing both ends of each first sacrificial layer 107.

For illustration purposes, a pair of the vertical holes H1 and H2 formed at both ends of each first sacrificial layer 107 may comprise of the first vertical hole H1 and the second vertical hole H2 arranged symmetrically as depicted in FIG. 4. Alternatively, first vertical holes H1 that expose adjacent first sacrificial layers 107, respectively, may be disposed adjacent to each other, and likewise with the second vertical holes H2.

Figure 5:
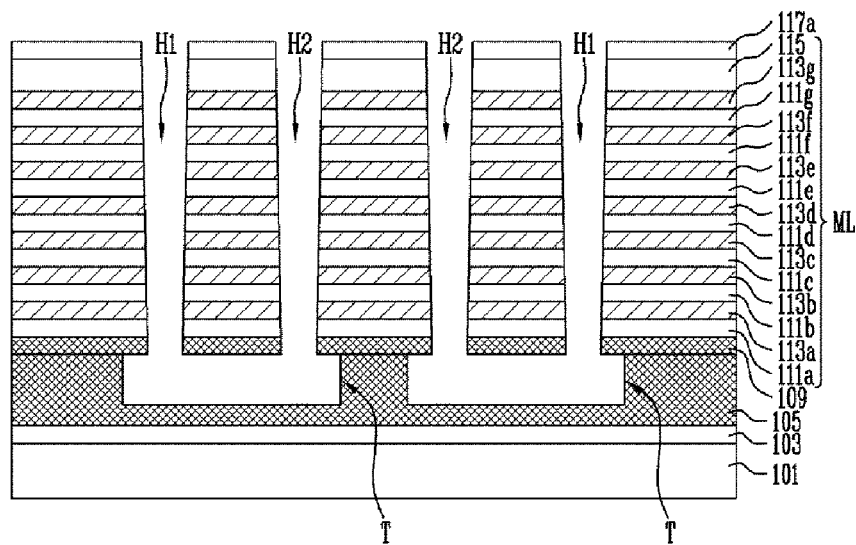

Referring to FIG. 5, the first sacrificial layers 107 may be removed by using a selective etchant, thus opening the trenches T. In other words, pipe holes may be formed so that the first vertical hole H1 and the second vertical hole H2 may be coupled through each of the pipe holes.

Specifically, a passivation layer may be formed along sidewalls of the first and second vertical holes H1 and H2 (not pictured), and may be formed of a material having an etch selectivity with respect to the first sacrificial layer 107. The first sacrificial layer 107 may be selectively removed to open the trench T, and the remaining passivation layer may be removed to expose the sidewalls of the first and second vertical holes H1 and H2.

Figure 6:
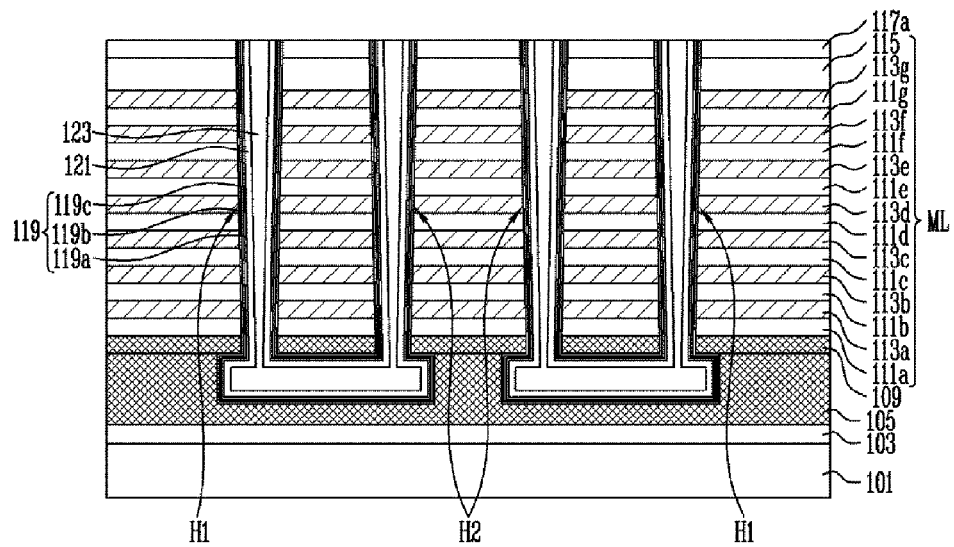

Referring to FIG. 6, memory layers 119 may be formed along a surface of an entire structure in which the trench T and the sidewalls of the first and second vertical holes H1 and H2 are exposed, and may have a stacked structure including a charge blocking layer 119a, a charge trap layer 119b and a tunnel insulating layer 119c. The charge trap layer 119b may comprise of silicon nitride (SiN), hafnium oxide ($HfO_2$), or zirconium oxide ($ZrO_2$), and the charge blocking layer 119a and the tunnel insulating layer 119c may comprise of silicon oxide.

Subsequently, U-shaped channel layers 121, which may comprise of silicon, may be formed along a surface of the entire structure, and particularly, over a surface of the memory layer 119. The trench T may be filled, and the first and second vertical holes H1 and H2 may be coated with the memory layer 119. The channel layer formed in the trench T may be defined as a pipe channel layer.

When the U-shaped channel layer 121 is formed over the surface of the memory layer 119, the trench T and the first and second vertical holes H1 and H2 coated with the U-shaped channel layer 121 may be filled with a gap-fill insulating layer 123, which may be formed of a dielectric material having high viscosity such that the long, narrow trenches T and the first and second vertical holes H1 and H2 may be filled without leaving voids. For example, the gap-fill insulating layer 123 may be formed using polysilazane PSZ.

Figure 7:
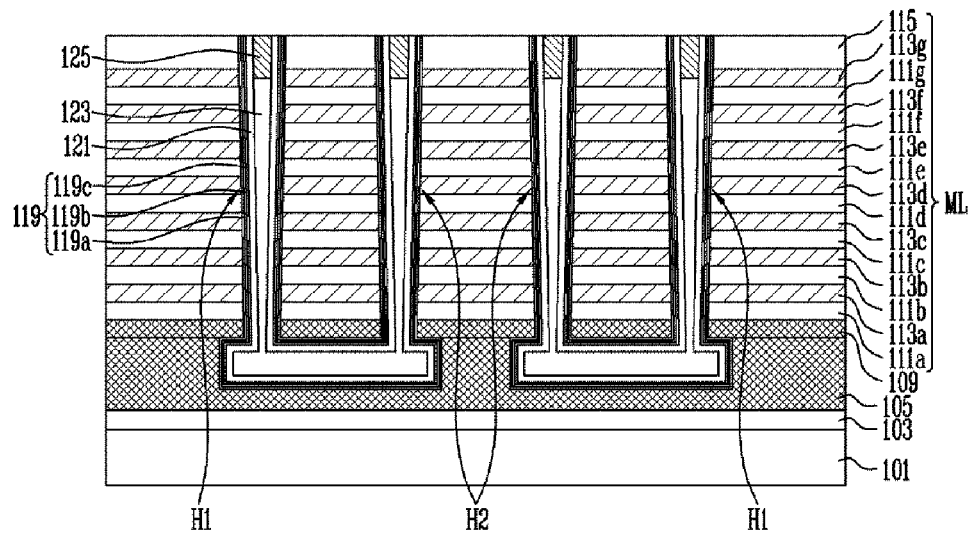

Referring to FIG. 7, the hard mask patterns 117a may be removed, and the gap-fill insulating layer 123 may be etched so that a height of the gap-fill insulating layer 123 may be reduced to less than that of the stacked structure ML. Subsequently, a region from which the gap-fill insulating layer 123 is removed may be filled with a doped polysilicon layer 125.

The doped polysilicon layer 125 may contact a portion of a sidewall of the U-shaped channel layer 121, and may reduce channel resistance of a memory string. Conditions, such as type and concentration of a dopant, may vary according to operating characteristics of a semiconductor device.

Figure 8:
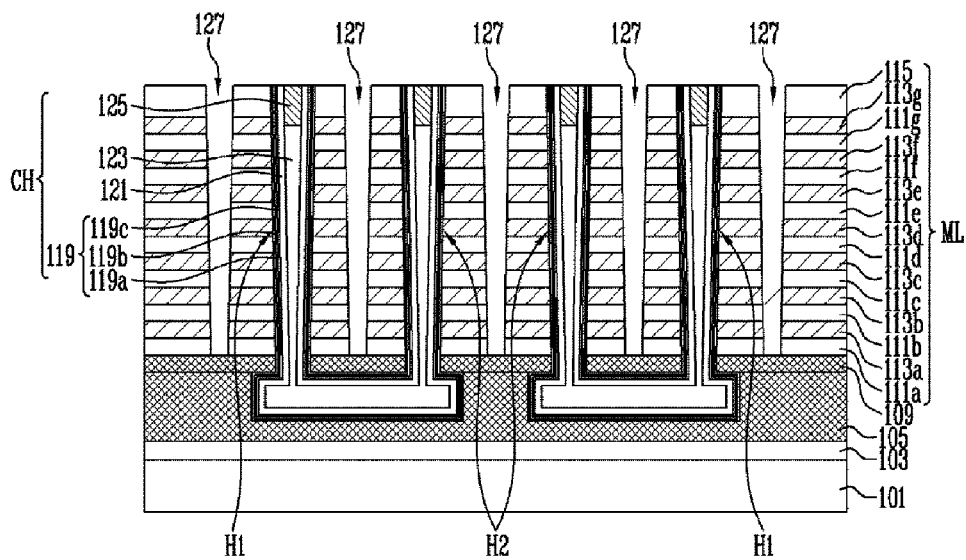

Referring to FIG. 8, the stacked structure ML may be etched between adjacent first vertical holes H1, adjacent second vertical holes H2 and adjacent first and second vertical holes H1 and H2 to thus form slits 127 which may pass through the stacked structure ML in the form of lines. Sidewalls of the second sacrificial layers 111a to 111g and 115 and the third sacrificial layers 113a to 113g of the stacked structure ML may be exposed.

Figure 9:
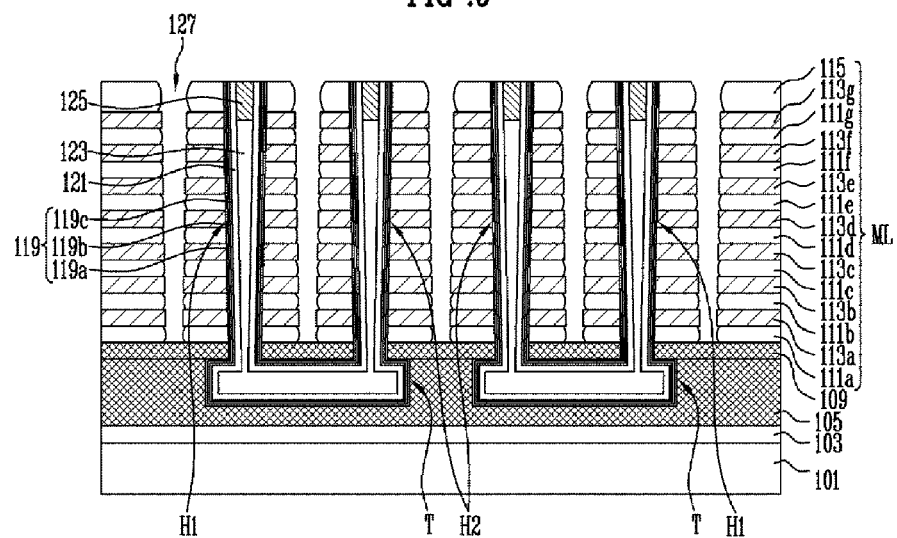

Referring to FIG. 9, the second sacrificial layers 111a to 111g and 115 may be selectively etched such that the sidewalls of the second sacrificial layers 111a to 111g and 115 exposed on inner walls of the slits 127 may protrude, and bottom edges of the sidewalls of the second sacrificial layers 111a to 111g and 115 may be partially etched so that the sidewalls of the second sacrificial layers 111a to 111g and 115 may have a semi-circular shape.

Figure 10:
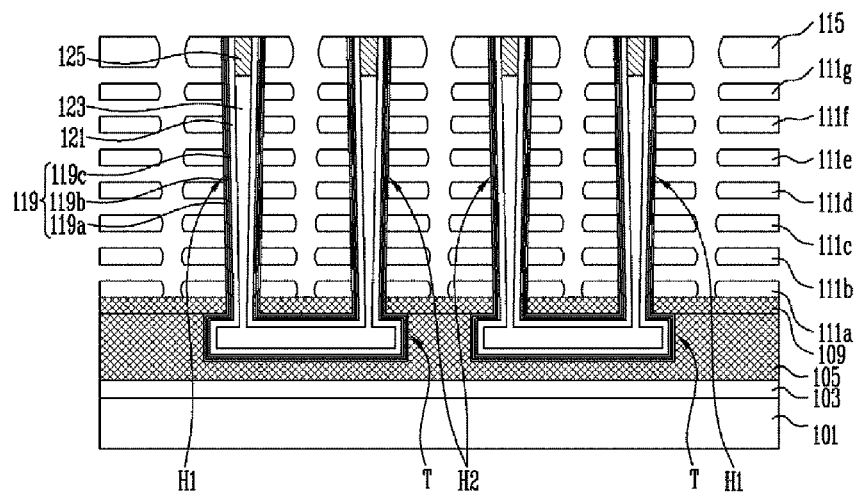

Referring to FIG. 10, the third sacrificial layers 113a to 113g exposed on the inner walls of the slits 127 may be selectively etched.

Figure 11:
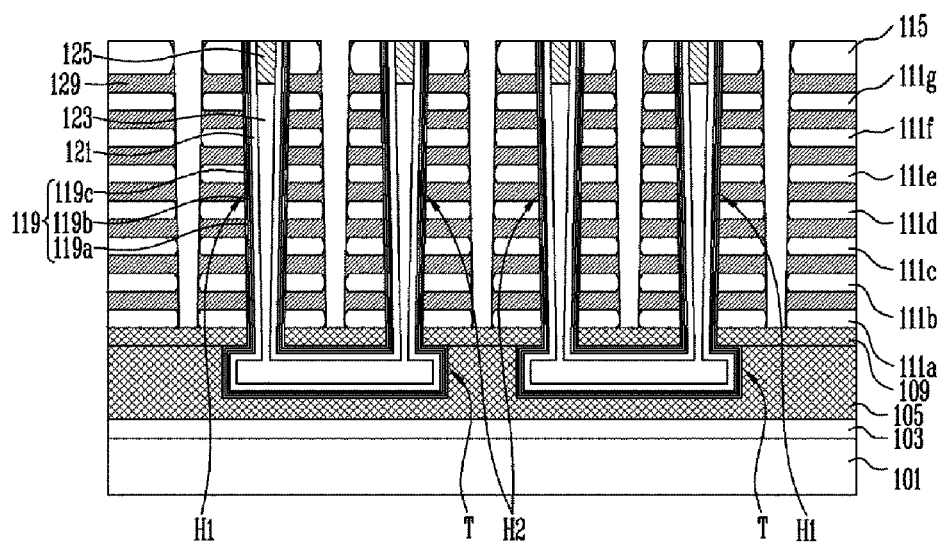

Referring to FIG. 11, word line conductive layers 129 may be formed to fill spaces from which the third sacrificial layers 113a to 113g are removed, and then etched along the inner walls of the slits 127. Here, after the word line conductive layers 129 are formed to fill the spaces between the second sacrificial layers 111a to 111g and 115, the word line conductive layers 129 formed along the inner walls of the slits 127 may be etched to separate the word line conductive layers 129, which fill the respective spaces, from each other. More specifically, the word line conductive layers 129 may be formed in the spaces between the second sacrificial layers 111a to 111g and 115. Each of the sidewalls of the second sacrificial layers 111a to 111g and 115 may have a central portion that is partially exposed, and top portions of the word line conductive layers 129 may not meet those of adjacent word line conductive layers.

Figure 12:
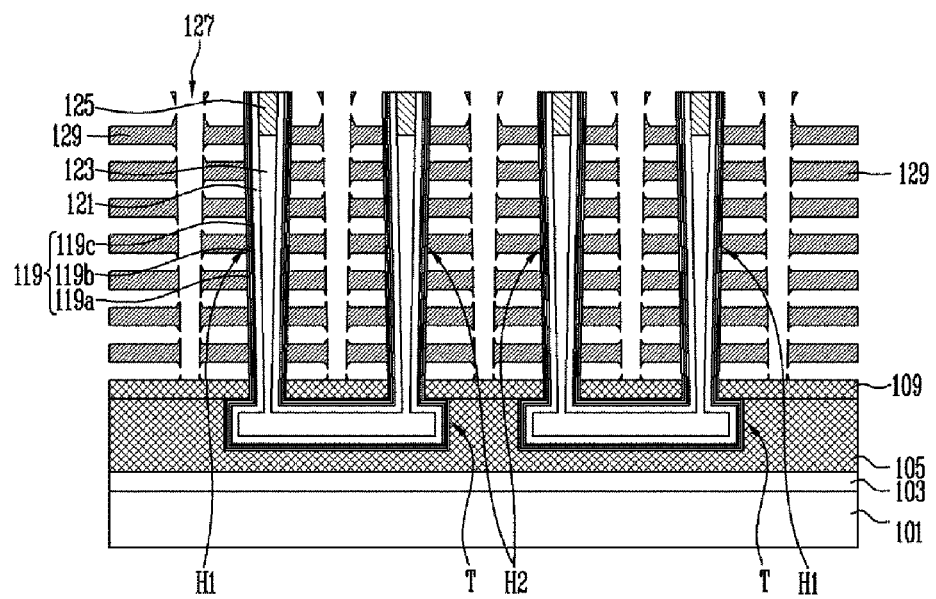

Referring to FIG. 12, the second sacrificial layers 111a to 111g and 115 exposed on the inner walls of the slits 127 may be selectively etched and removed, providing each of the word line conductive layers 129 to be of an inverted trapezoidal shape such that an upper width of the word line layer 129 may be greater than a lower width thereof towards the bottom surface of the memory layer 119. In this manner, a plurality of memory cells may be stacked over the substrate.

Figure 13:
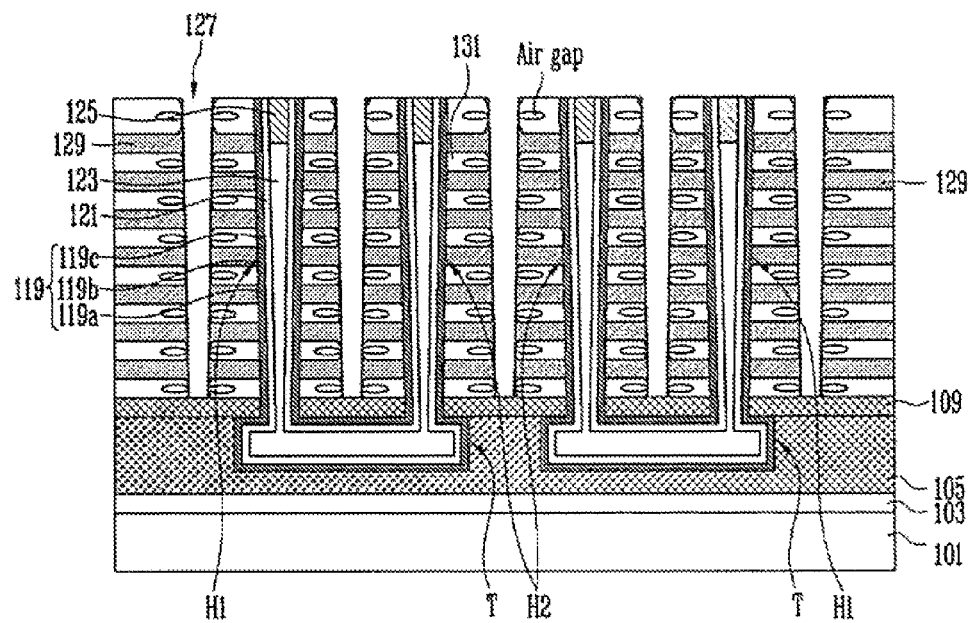

Referring to FIG. 13, second interlayer insulating layers 131 may be formed, and may fill the spaces from which the second sacrificial layers are removed. Since each of the spaces from which the second sacrificial layer are removed has an opening that has a width narrower than a width of an internal portion of the space, the opening may be sealed before the opening is completely filled with the second interlayer insulating layer 131. As a result, an air gap may be formed in each of the second interlayer insulating layers 131.

Figure 14:
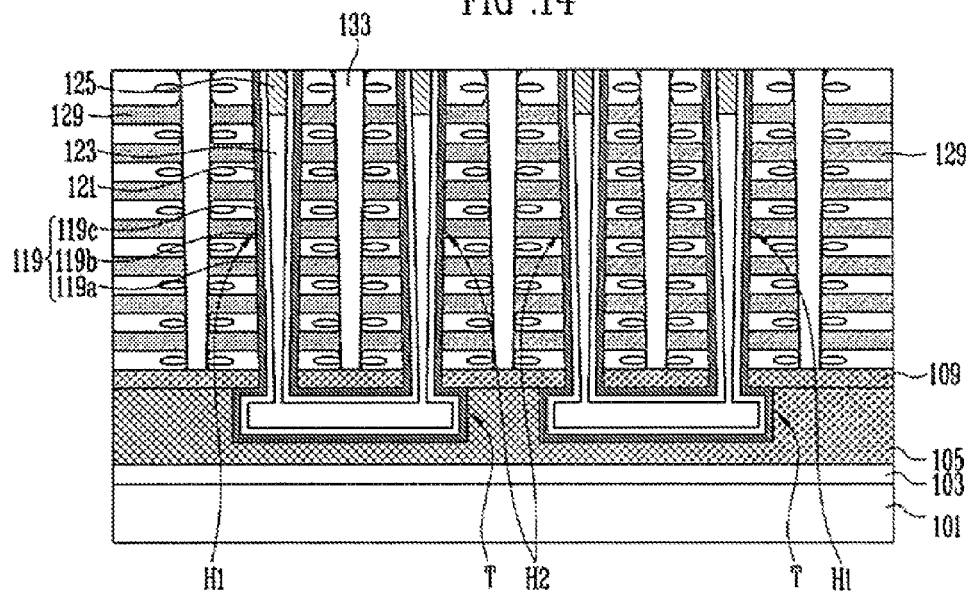

Referring to FIG. 14, the slits 127 may be filled with a gap-fill insulating layer 133, which may be formed of a dielectric material having high viscosity such that voids do not form. For example, the gap-fill insulating layer 133 may be formed of polysilazane (PSZ).

Though not illustrated in FIG. 14, first and second select lines may be formed over stacked word lines. As a result, U shape strings may be formed over the substrate, and may include a first select transistor, memory cells and a second select transistor. A source line may also be formed when the word lines are formed. Memory layers may function as gate insulating layers of the first select transistor and the second select transistor.

As described above, a 3-D non-volatile memory device according to an embodiment of the present invention may have an air gap formed in an interlayer insulating layer between word line conductive layers to reduce capacitance between the word lines, so that a program speed of the device may be improved.

Figure 15:
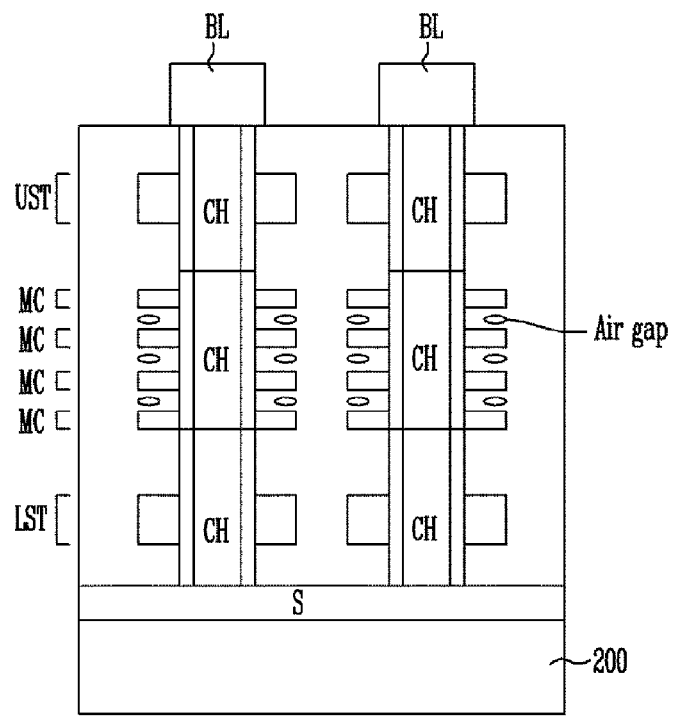
FIG. 15 is a cross-sectional view of a non-volatile memory device according to another embodiment of the present invention.

FIG. 15 is a cross-sectional view of the structure of a 3-D non-volatile memory device according to another embodiment of the present invention.

In the non-volatile memory device according to this embodiment of the present invention as illustrated in FIG. 15, a lower select transistor LST, memory cells MC and an upper select transistor UST may be formed over a semiconductor substrate 200 including a source region S. The memory cells MC may be formed by using the processes described in connection with FIGS. 3 to 14. Air gaps may be formed between stacked word lines.

With the above-described structure, an air gap may be formed in an interlayer insulating layer between the word line conductive layers, thus reducing capacitance between word lines. As a result, a program speed of the device may be increased.

Figure 16:
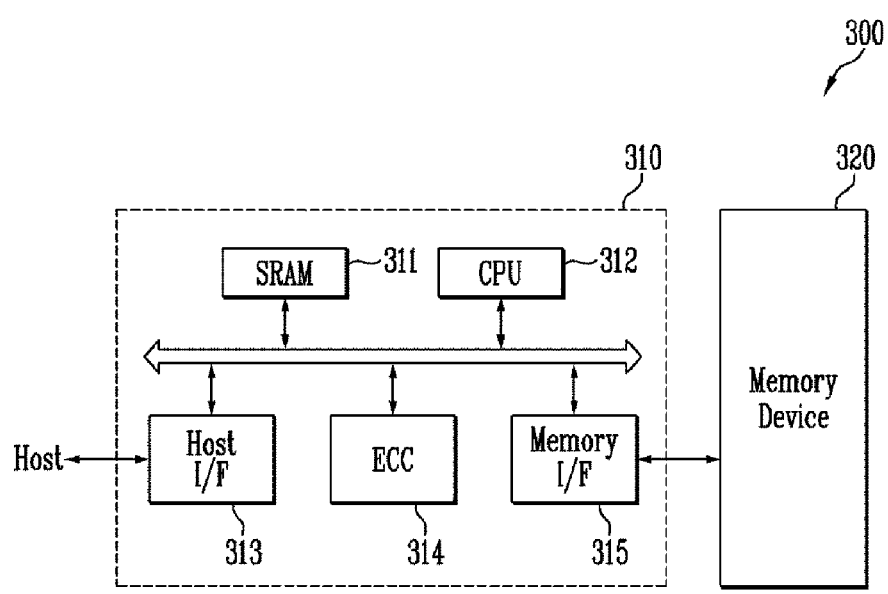
FIG. 16 is a schematic block diagram of a memory system according to an embodiment of the present invention.

FIG. 16 is a schematic block diagram of a memory device according to an embodiment of the present invention.

Referring to FIG. 16, a memory system 300 according to an embodiment of the present invention may include a memory device 320 and a memory controller 310.

The memory device 320 may include the 3-D non-volatile memory device described in connection with FIG. 13. and may include the non-volatile memory device that includes a pipe connection transistor and a driving transistor. The pipe connection transistor may be formed over a first region of a semiconductor substrate, and the driving transistor may be formed over a second region of the semiconductor substrate. The pipe connection transistor may include a pipe gate and a pipe channel layer. The pipe gate may be formed over the first region of the semiconductor substrate, and the pipe channel layer may be formed in the pipe gate. The driving transistor may include a driving gate and a dummy pattern. The driving gate may be formed over the second region of the semiconductor substrate, and the dummy pattern may open a contact region of the driving gate and be formed in the driving gate.

In addition, the memory device 320 may further include another type of semiconductor memory device such as a DRAM device and/or an SRAM device.

The memory controller 310 may control data exchange between a host and the memory device 320 and may include a processing unit (CPU) 312 configured to control the general operation of the memory system 300. In addition, the memory controller 310 may include SRAM 311 that is used as an operation memory of the processing unit 312, a host interface (I/F) 313 and a memory I/F 315. The host interface 313 may have a data exchange protocol between the memory system 300 and the host, and the memory I/F 315 may couple the memory controller 310 and the memory device 320. The memory controller may further include an ECC block 314, which may detect and correct errors when data is read from the non-volatile memory device 320. Though not shown in FIG. 16, the memory system 300 may further include a ROM device that stores code data for an interface with the host, which. The may be used as a portable data storage card. The memory system 300 may also be formed of a solid state disk (SSD) that replaces a hard disk of a computer system.

According to an embodiment of the present invention, an air gap may be formed between word line conductive layers, so that capacitance between word lines may be reduced to thus increase a program speed.

What is claimed is:

1. A three-dimensional (3-D) non-volatile memory device, comprising:
    a plurality of vertical channel layers protruding from a substrate;
    a plurality of interlayer insulating layers and a plurality of memory cells stacked alternately along the plurality of vertical channel layers, wherein the memory cells include memory layers and word line conductive layers;
    slits passing through the word line conductive layers between the vertical channel layers; and
    an air gap formed in the plurality of interlayer insulating layers disposed between the word line conductive layers,
    wherein each of the word line conductive layers has a width that increases in a direction from the vertical channel layers to the slits.

2. The 3-D non-volatile memory device of claim 1, wherein the memory layers and word line conductive layers surround surfaces of the vertical channel layers.

3. The 3-D non-volatile memory device of claim 2, wherein each of the memory layers comprise a tunnel insulating layer, a charge trap layer and a charge blocking layer.

4. The 3-D non-volatile memory device of claim 1, further comprising:
    a pipe gate formed under the plurality of memory cells; and
    a pipe channel layer formed in the pipe gate and coupled to a pair of the vertical channel layers.

5. The 3-0 non-volatile memory device of claim 1, further comprising:
    a gap-fill insulating layer formed in each of the vertical channel layers and having a smaller height than each of the vertical channel layers; and
    a doped polysilicon layer formed over the gap-fill insulating layer and formed in each of the vertical channel layers.

6. A method of manufacturing a three-dimensional (3-D) non-volatile memory device, the method comprising:
    forming a stacked structure by alternately stacking a plurality of first sacrificial layers and a plurality of second sacrificial layers over a substrate;

forming a plurality of vertical holes passing through the stacked structure;

forming a plurality of channels by forming memory layers and channel layers along surfaces of the plurality of vertical holes;

forming slits passing through the stacked structure between the plurality of channels to expose sidewalls of the first sacrificial layers and the second sacrificial layers;

etching portions of the sidewalls of the first sacrificial layers such that the sidewalls of the first sacrificial layer have a semi-circular shape;

removing the second sacrificial layers;

forming word line conductive layers in spaces from which the second sacrificial layers are removed;

removing the first sacrificial layers; and forming an interlayer insulating layer in the spaces from which the second sacrificial layers are removed such that an air gap is formed between the word line conductive layers.

7. The method of claim 6, wherein in the etching of the portions of the sidewalls of the first sacrificial layer, portions of top and bottom edges of the sidewalls of the first sacrificial layers are etched.

8. The method of claim 6, wherein in the forming of the word line conductive layers, each of the word line conductive layers has a width that increases in a direction from the channel layers to the slits.

9. The method of claim 6, wherein the forming of the word line conductive layers comprises:

forming the word line conductive layers such that the word line conductive layers fill the spaces from which the first sacrificial layers are removed; and etching the word line conductive layers formed along inner walls of the slits such that the word line conductive layers filling the spaces are separated from each other.

10. The method of claim 6, wherein in the removing of the first sacrificial layers, each of the spaces has a height that increases in a direction from the channel layers to the slits.

11. The method of claim 6, wherein the first sacrificial layers are formed of materials having an etch selectivity with respect to the second sacrificial layers.

12. The method of claim 11, wherein each of the first sacrificial layers comprise of oxide, and each of the second sacrificial layers comprise of nitride.

13. The method of claim 6, further comprising filling the plurality of channels with first gap-fill layers after the forming of the plurality of channels.

14. The method of claim 6, further comprising filling the slits with second gap-fill layers after the forming of the interlayer insulating layer.

15. The method of claim 6, wherein each of the memory layers comprises a tunnel insulating layer, a charge trap layer and a charge blocking layer.

16. The method of claim 6, further comprising, before the forming of the stacked structure:

forming a pipe gate over the substrate;

forming trenches by etching the pipe gate; and filling the trenches with third sacrificial layers.

17. The method of claim 16, further comprising forming pipe holes coupled to a pair of the vertical holes by removing the third sacrificial layers after the forming of the vertical holes.

18. The method of claim 17, wherein in the forming of the plurality of channels, the memory layers and the channel layers are formed along surfaces of the pipe holes at the same time as the memory layers and the channel layers are formed along the surfaces of the plurality of vertical holes.

19. A memory system, comprising:

the 3-D non-volatile memory device of claim 1; and a memory controller configured to control the 3-D non-volatile memory device.

* * * * *